(12) United States Patent
Kohanek et al.

(10) Patent No.: US 7,905,030 B2
(45) Date of Patent: Mar. 15, 2011

(54) LINEARITY MEASURING APPARATUS FOR WAFER ORIENTATION FLAT

(75) Inventors: Cindy Kohanek, Salem, OR (US); Gary Babb, Salem, OR (US)

(73) Assignees: Sumco Corporation, Tokyo (JP); Sumco Phoenix Corporation, Phoenix, AZ (US)

( * ) Notice: Subject to any disclaimer, the term of this patent is extended or adjusted under 35 U.S.C. 154(b) by 0 days.

(21) Appl. No.: 09/904,425

(22) Filed: Jul. 12, 2001

(65) Prior Publication Data

US 2002/0189118 A1   Dec. 19, 2002

(30) Foreign Application Priority Data

Jun. 18, 2001   (JP) ................................ 2001-183702

(51) Int. Cl.
*G01B 5/20* (2006.01)
(52) U.S. Cl. .......................................... 33/553; 33/533
(58) Field of Classification Search ............... 33/501.02, 33/533, 549, 551, 553, 554, 568, 792
See application file for complete search history.

(56) References Cited

U.S. PATENT DOCUMENTS

| | | | |
|---|---|---|---|
| 4,680,865 A * | 7/1987 | Danielli et al. ................ | 33/549 |
| 4,833,790 A * | 5/1989 | Spencer et al. ................ | 33/549 |
| 5,205,046 A * | 4/1993 | Barnett et al. ................. | 33/533 |
| 5,433,013 A * | 7/1995 | Woodhouse .................. | 33/533 |
| 5,539,992 A * | 7/1996 | Woodhouse .................. | 33/533 |
| 5,639,953 A * | 6/1997 | Renslow ....................... | 33/533 |
| 6,148,532 A * | 11/2000 | Ellis ............................. | 33/533 |
| 6,185,830 B1 * | 2/2001 | Walters ......................... | 33/533 |
| 6,195,905 B1 * | 3/2001 | Cole ............................. | 33/533 |
| 6,408,532 B1 * | 6/2002 | Keys et al. .................... | 33/549 |

FOREIGN PATENT DOCUMENTS

JP          807316    *  3/1996
JP        10022368    *  1/1998

OTHER PUBLICATIONS

Mitutoyo Digimatic Indicators, Bulletin No. 1824, Jan. 2005.*
http://www.mitutoyo,co,jp/eng/corporate/history/index_03.html (no date).*
http://wwwlmytoolstore.com/mitutoyo/575-01.html (no date).*

* cited by examiner

*Primary Examiner* — G. Bradley Bennett
(74) *Attorney, Agent, or Firm* — Greenblum & Bernstein, P.L.C.

(57) ABSTRACT

Straight tracks are formed in a first direction on a base. The top surface of a platform is formed so as to be flat to mount a wafer having an Ori-Fla, and the platform is moved in the first direction by being engaged with the straight tracks via engagement means. A block having a flat face against which the Ori-Fla of the wafer abuts and which is parallel with the first direction is installed with a first clearance L being provided with the straight track in a second direction perpendicular to the first direction. Wafer fixing means for fixing the wafer in a state in which the wafer is mounted on the platform is provided in the platform, and a measurement device having a probe opposed to the straight track and capable of being displaced in the second direction is installed on the base with a second clearance M being provided with the block in the first direction. When a clearance between the tip end of the probe and the straight track is taken as N, the relationship of 0 μm<L−N≦100 μm exists. By this configuration, the linearity of the Ori-Fla can be measured accurately in a short period of time.

5 Claims, 8 Drawing Sheets

(a)

(b)

LINEARITY MEASURING APPARATUS FOR WAFER ORIENTATION FLAT

CROSS-REFERENCES TO RELATED APPLICATIONS

This application claims priority of Japanese Application No. 2001-183702 filed Jun. 18, 2001, the complete disclosure of which is hereby incorporated by reference.

BACKGROUND OF THE INVENTION

1. Field of the Invention

The present invention relates to a measuring apparatus that provides numerical data relative to the linearity of an orientation flat (hereinafter referred to as an Ori-Fla).

2. Description of Related Art

Conventionally, examination of the linearity of an Ori-Fla portion has been by visual methodology, with no provision of quantitative data in which to make judgements. On the other hand, there has been disclosed a wafer Ori-Fla positioning method in which an Ori-Fla is positioned by pressing a wafer against a positioning mechanism provided on a wafer chuck mounting surface (Unexamined Japanese Patent Publication No. 10-22368). In this positioning method, the wafer chuck mounting surface is provided so as to be inclined, and a gas flow for floating a wafer with respect to a wafer chuck is generated by air blowing means.

In the positioning method configured as described above, when air is blown from the air blowing means in a state in which a wafer is mounted on the wafer chuck mounting surface, the wafer moves smoothly under gravity toward a positioning mechanism along the inclination of the wafer chuck mounting surface. As a result, the positioning of the Ori-Fla can be performed reliably.

Further, there has been disclosed an exposure device that has a stage, a rough positioning mechanism, and number detecting means, and can perform exact rough positioning of a wafer without pattern at the time of first-level pattern exposure (Unexamined Japanese Patent Publication No. 8-78316). In this exposure device, at least three stopper members are provided to roughly position a wafer on the stage, and the stage moves in the longitudinal and transverse X & Y directions and in the rotation direction of θ. Also, the rough positioning mechanism performs rough positioning by causing the peripheral portions of wafer mounted on the stage to abut against the stopper members. Further, the number detecting means detects an identification number scribed on the wafer positioned roughly so that the wafer moves on the stage until the identification number arrives at a predetermined position.

In the conventional method in which the linearity of the Ori-Fla portion is examined visually, however, the acceptability or non-acceptability of linearity cannot be determined quantitatively. Also, in the conventional Ori-Fla positioning method disclosed in the aforementioned Unexamined Japanese Patent Publication No. 10-22368, or in the exposure device disclosed in Unexamined Japanese Patent Publication No. 8-78316, the fabrication accuracy of the Ori-Fla, especially the fabrication accuracy in chamfering the Ori-Fla is poor because the linearity of the Ori-Fla of wafer itself is not measured. For example, when as shown in FIG. 8(a), a vertex P is formed at the center of an Ori-Fla 8a, and the Ori-Fla 8a is formed of a first side 8b and a second side 8c on opposite sides of the vertex P, there arises a problem in that the crystalline orientation of a wafer 8 deflects comparing the time when the first side 8b is aligned with the positioning mechanism with the time when the second side 8c is aligned with the positioning mechanism. Further, the Ori-Fla 8a of the wafer 8 as shown in FIG. 8(b) also presents the same problem. With an extremely high level of human expertise, judgements can be made visually if the maximum allowable value of the Ori-Fla linearity is ≧25 μm, if the maximum allowable linearity value of the Ori-Fla is <25 μm, there arises a problem in that it is nearly impossible to determine the measurement visually.

SUMMARY OF THE INVENTION

An object of the present invention is to provide a linearity measuring apparatus for a wafer Ori-Fla, the linearity of which can be measured accurately in a short period of time.

The present invention provides a linearity measuring apparatus for a wafer orientation flat, comprising a base in which one, two, or more straight tracks are formed in a first direction; a platform which is configured so as to be movable in the first direction by being engaged with the straight track via engagement means, and is further provided with a top surface formed so as to be flat to mount a wafer having an orientation flat; a block which is installed on the base with a predetermined first clearance L being provided with the straight track in a second direction perpendicular to the first direction, and has a flat face against which the orientation flat of the wafer mounted on the platform abuts and which is parallel with the first direction; wafer fixing means provided in the platform to fix the wafer in a state in which the wafer is mounted on the platform; and a measurement device which is installed on the base with a predetermined second clearance M being provided with the block in the first direction, and has a probe opposed to the straight track and capable of being displaced in the second direction, wherein when the clearance between the tip end of the probe and the straight track is taken as N, the following equation (1) is satisfied $$0\ \mu m < L - N \leq 100\ \mu m \tag{1}$$

In order to measure the linearity of an Ori-Fla by using the linearity measuring apparatus for a wafer Ori-Fla in accordance with the present invention, the platform on which a wafer is not mounted is first moved in the first direction so as to be opposed to the block. Next, a wafer is mounted on the top surface of the platform, and the Ori-Fla of the wafer is allowed to abut against the flat face of block so that the Ori-Fla is substantially parallel with the flat face. Thereafter, the wafer is fixed on the platform by the wafer fixing means. Next, the platform is moved in the first direction, by which the Ori-Fla is brought into measurement range with the probe of the measurement device, the probe is then lowered to contact the Ori-Fla. Further, the platform is moved in the first direction, by which the probe of the measurement device resides on the Ori-Fla, with the probe output signal registering as deflection on the measurement device display. By reading the deflection registered on the measurement device display, the linearity of the Ori-Fla can be provided quantitatively as numerical data.

DETAILED DESCRIPTION OF THE PREFERRED EMBODIMENTS

An embodiment of the present invention will now be described with reference to the accompanying drawings.

Figure 1:
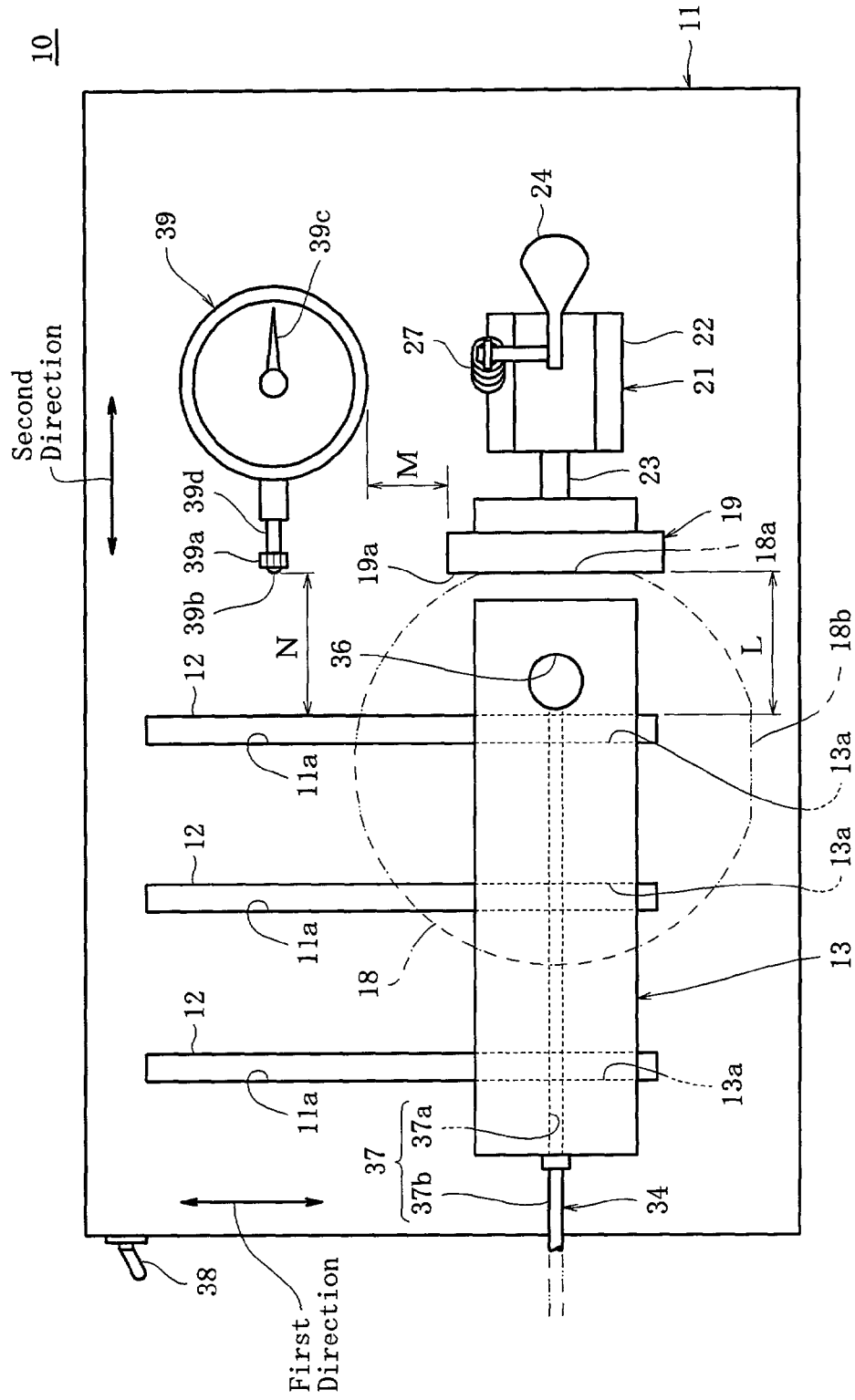
FIG. 1 is a plan view of one embodiment of a linearity measuring apparatus in accordance with the present invention, showing a state before a wafer is mounted on a platform.
Figure 5:
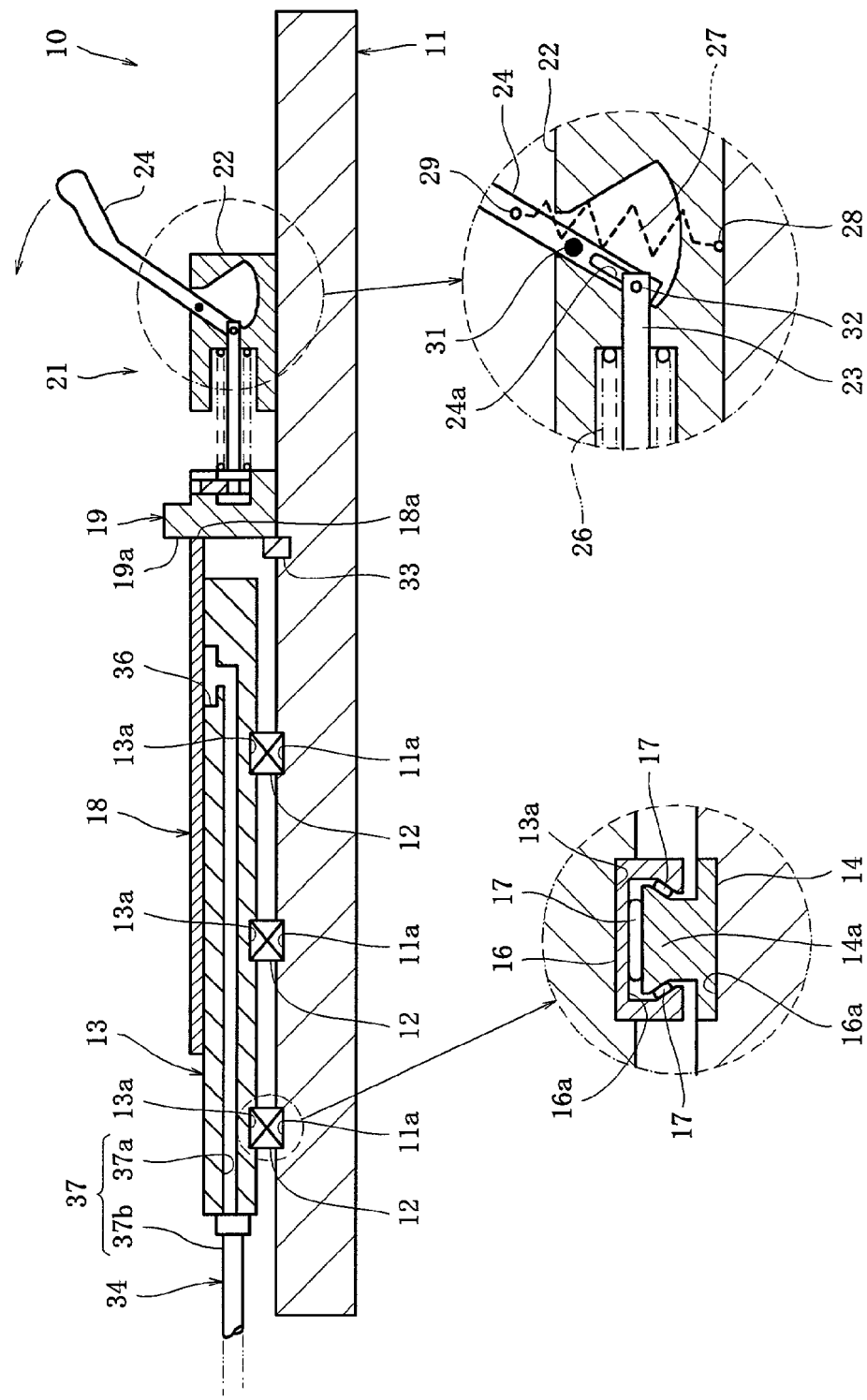
FIG. 5 is a sectional view taken along the line A-A of FIG. 2.

As shown in FIGS. 1 and 5, three straight tracks 11a such as linear motion guides (LM guides) are formed in a base 11 of a linearity measuring apparatus 10 so as to extend in a first direction, and a platform 13 engages with these straight tracks 11a via engagement means 12. This engagement means 12 has a fixed rail 14 and a movable rail 16 as shown in detail in FIG. 5. The fixed rail 14 is fixed by being inserted in the straight track 11a, and the movable rail 16 is fixed by being inserted in a groove 13a formed in the bottom surface of the platform 13 and is fitted on the fixed rail 14 via needle-shaped rollers 17. The fixed rail 14 is formed with a convex portion 14a that projects upward and extends in the longitudinal direction of the rail 14. The movable rail 16 is formed with a concave portion 16a that has a cross-sectional shape corresponding to the convex portion 14a and a size larger than the convex portion 14a and extends in the longitudinal direction of the rail 16. The needle-shaped roller 17 is configured so as to rotatively slide on the movable rail 16 and rolls on the fixed rail 14. Thereby, the movable rail 16 is configured so as to move in the first direction along the fixed rail 14 or the straight track 11a together with the platform 13. The top surface of the platform 13 is formed so as to be flat so that a wafer 18 is mounted. The wafer 18, having a diameter in the range of 50 to 300 mm, has a first Ori-Fla 18a and a second Ori-Fla 18b. The number of straight tracks is not limited to three, and may be one, two, or more. Also, the fixed rail may be formed with a concave portion, not the convex portion, and the movable rail may be formed with a convex portion, not the concave portion. Further, between the fixed rail and the movable rail, steel balls or sliding bearings may be interposed instead of the needle-shaped rollers.

On the other hand, a block 19 is provided on the base 11 with a predetermined first clearance L (FIG. 1) being provided with the straight track 11a in a second direction perpendicular to the first direction (FIGS. 1 and 5). This block 19 is installed to the base 11 via release means 21. The block 19 is formed with a flat face 19a that is parallel with the first direction and perpendicular to the top surface of the base 11 so that the first Ori-Fla 18a or the second Ori-Fla 18b of the wafer 18 mounted on the platform 13 can abut against the flat face 19a. The first clearance L is a clearance between the block 19 and the straight track 11a of the three straight tracks 11a which is closest to the block 19. This first clearance L is formed so as to be greater than the distance from the straight track 11a closest to the block 19 to the face of the platform 13 opposed to the block 19. As shown in detail in FIGS. 5 and 6, the release means 21 has a release body 22 installed on the base 11 behind the block 19, a rod 23 one end of which is inserted and fixed in the block 19 and the other end of which is slidably inserted in the release body 22, and an operating lever 24 the substantially central portion of which is swingingly provided on the release body 22 via a first pin 31 and the lower end of which is connected to the other end of the rod 23 via a second pin 32.

A helical compression spring 26 is provided around the rod 23. One end of this spring 26 is pressed on the block 19, and the other end thereof is pressed on the release body 22. Further, a helical tension spring 27 is provided between the release body 22 and the operating lever 24. The lower end of this spring 27 is fixed to a lower pin 28 fixed to the release body 22, and the upper end thereof is fixed to an upper pin 29 fixed to the operating lever 24. The lower pin 28 is located on the vertical line passing through the first pin 31, and the upper pin 29 is located at an upper position separated a predetermined distance from the first pin 31 in the longitudinal direction of the operating lever 24. The operating lever 24 is configured so as to be swung between a first position (FIG. 5) at which the first Ori-Fla 18a or the second Ori-Fla 18b is allowed to abut against the flat face 19a of the block 19 and thereby the wafer 18 can be positioned and a second position (FIG. 6) at which the block 19 is separated from the first Ori-Fla 18a or the second Ori-Fla 18b, that is, the block 19 goes apart from the straight track 11a in the second direction.

The spring constant of the helical tension spring 27 is set so as to be larger than that of the helical compression spring 26. Therefore, when the operating lever 24 is operated to the second position, the elastic force of the helical tension spring 27 overcomes that of the helical compression spring 26, so that the helical tension spring 27 can temporarily hold the operating lever 24 at the second position. Reference numeral 33 in FIGS. 5 and 6 denotes a flat bar fixed to the base 11 in parallel with the straight track 11a. This flat bar 33 has a function such that when the operating lever 24 is operated to the first position (FIG. 5), the flat face 19a of the block 19 abuts against the flat bar 33, by which the flat face 19a of the block 19 is corrected so as to become parallel with the straight track 11a. Also, reference numeral 24a denotes an elongated hole formed in a lower end portion of the operating lever 24 so that the second pin 32 is inserted in this elongated hole 24a.

On the other hand, the platform 13 is provided with wafer fixing means 34 for fixing the wafer 18 in a state in which the wafer 18 is mounted on the platform 13 (FIGS. 1 and 5). This wafer fixing means 34 includes a suction port 36 for attracting and fixing the wafer 18, which is formed in the top surface of the platform 13, a suction hole 37a one end of which communicates with the suction port 36, which is formed in the platform 13, a suction pipe 37b one end of which is connected to the other end of the suction hole 37a and the other end of which is connected to a vacuum supply (not shown), a switching valve (not shown) for switching the suction port 36 to a negative pressure or the atmospheric pressure, which is provided in the suction pipe 37b, and a selector switch 38 for turning on/off the switching valve. The suction hole 37a and the suction pipe 37b constitute a suction passage 37. The switching valve, which is an electromagnetic valve for 3-port 2-position switching, is configured so that when the selector switch 38 is turned on, the suction port 36 communicates with the vacuum supply to provide a negative pressure, and when the selector switch 38 is turned off, the suction port 36 communicates with the atmosphere to provide the atmospheric pressure. Also, a measurement device 39, for example a dial gauge having a probe 39a at the tip end of a spindle 39d is installed on the base 11 (FIGS. 1 to 4 and 7). This measurement device 39 is located on the base 11 with a predetermined second clearance M (FIG. 1) being provided with the block 19 in the first direction, and is configured so that the probe 39a can be displaced in the second direction in such a manner as to be opposed to the straight track 11a. At the tip end of the probe 39a, there is provided a steel ball 39b capable of rolling on the first Ori-Fla 18a or the second Ori-Fla 18b. Taking a clearance between the tip end of the probe 39a and the straight track 11a as N, the measurement device 39 is fixed on the base 11 so that the following equation (1) is satisfied.

$$0 \ \mu m < L-N \leqq 100 \ \mu m \quad (1)$$

Preferably 40 $\mu m \leqq L-N \leqq 60 \ \mu m$.

The measurement device 39 has a display 39c, for example a needle which indicates data according to displacement of the probe 39a.

A method for using an apparatus 10 for measuring the linearity of the first Ori-Fla 18a of the wafer 18, which is constructed as described above, will be described with reference to FIGS. 1 to 7.

Figure 2:
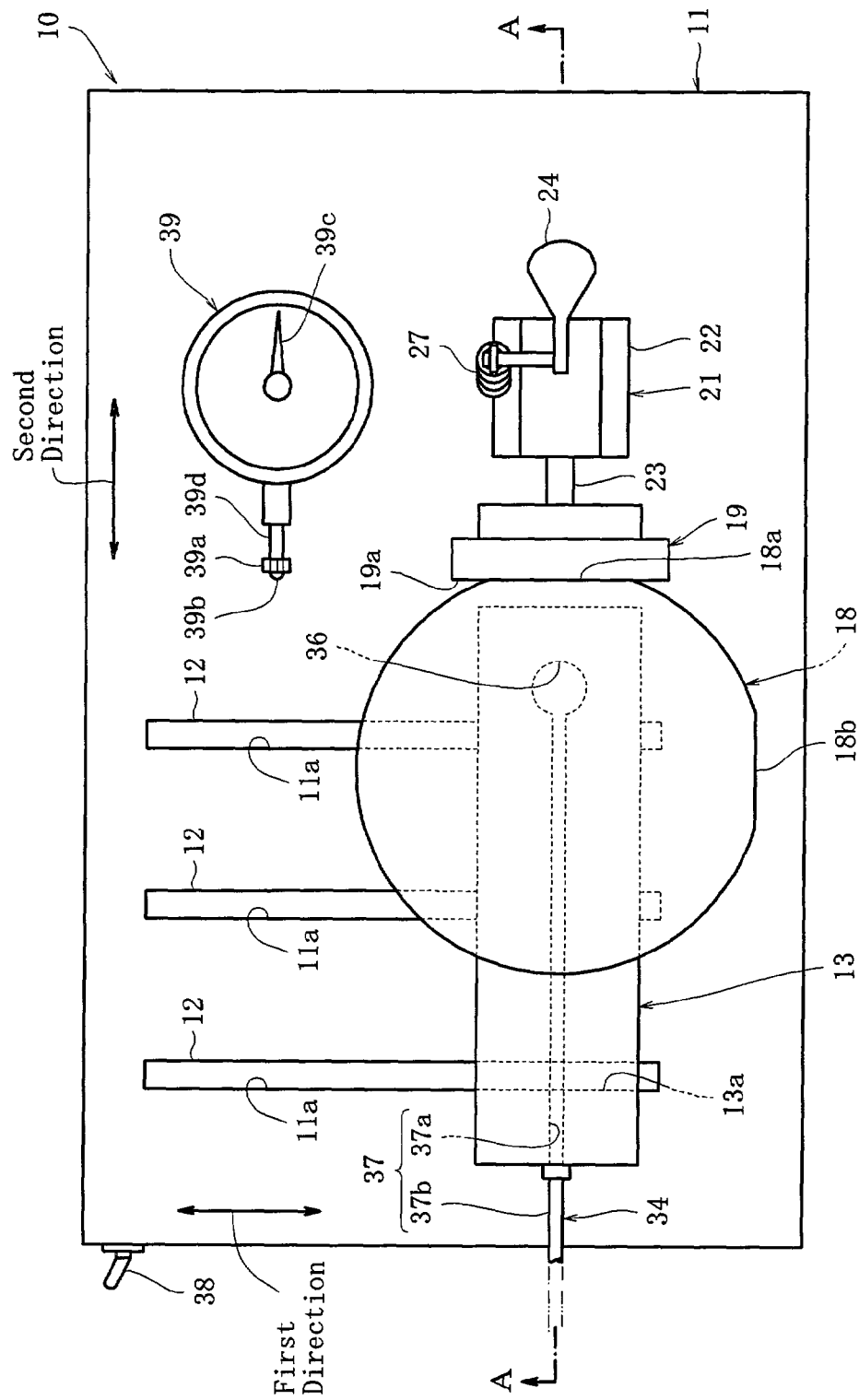
FIG. 2 is a plan view corresponding to FIG. 1, showing a state in which a wafer is mounted on a platform and a first Ori-Fla of the wafer is allowed to abut against a block.
Figure 3:
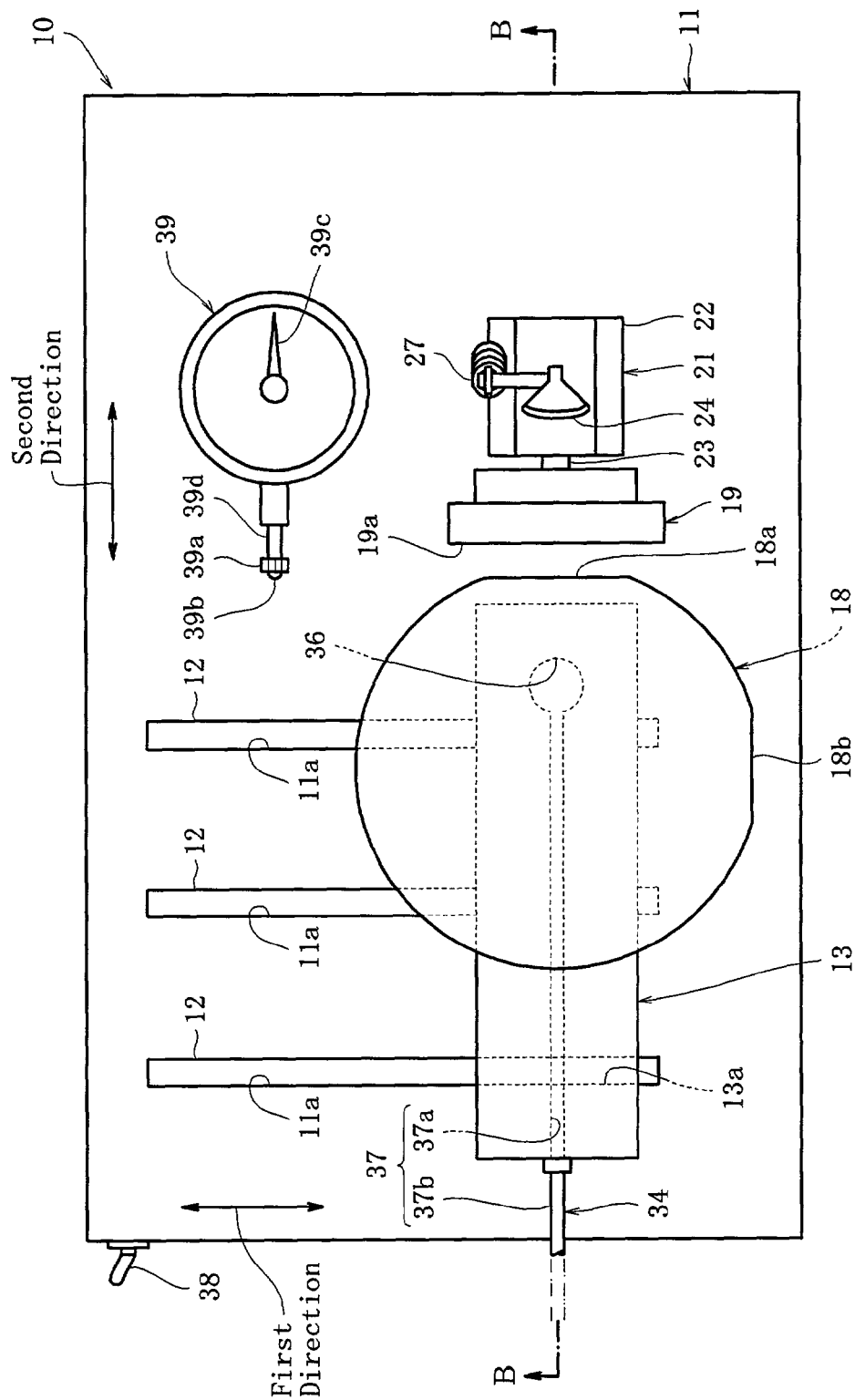
FIG. 3 is a plan view corresponding to FIG. 1, showing a state in which a block is separated from a first Ori-Fla of the wafer.
Figure 4:
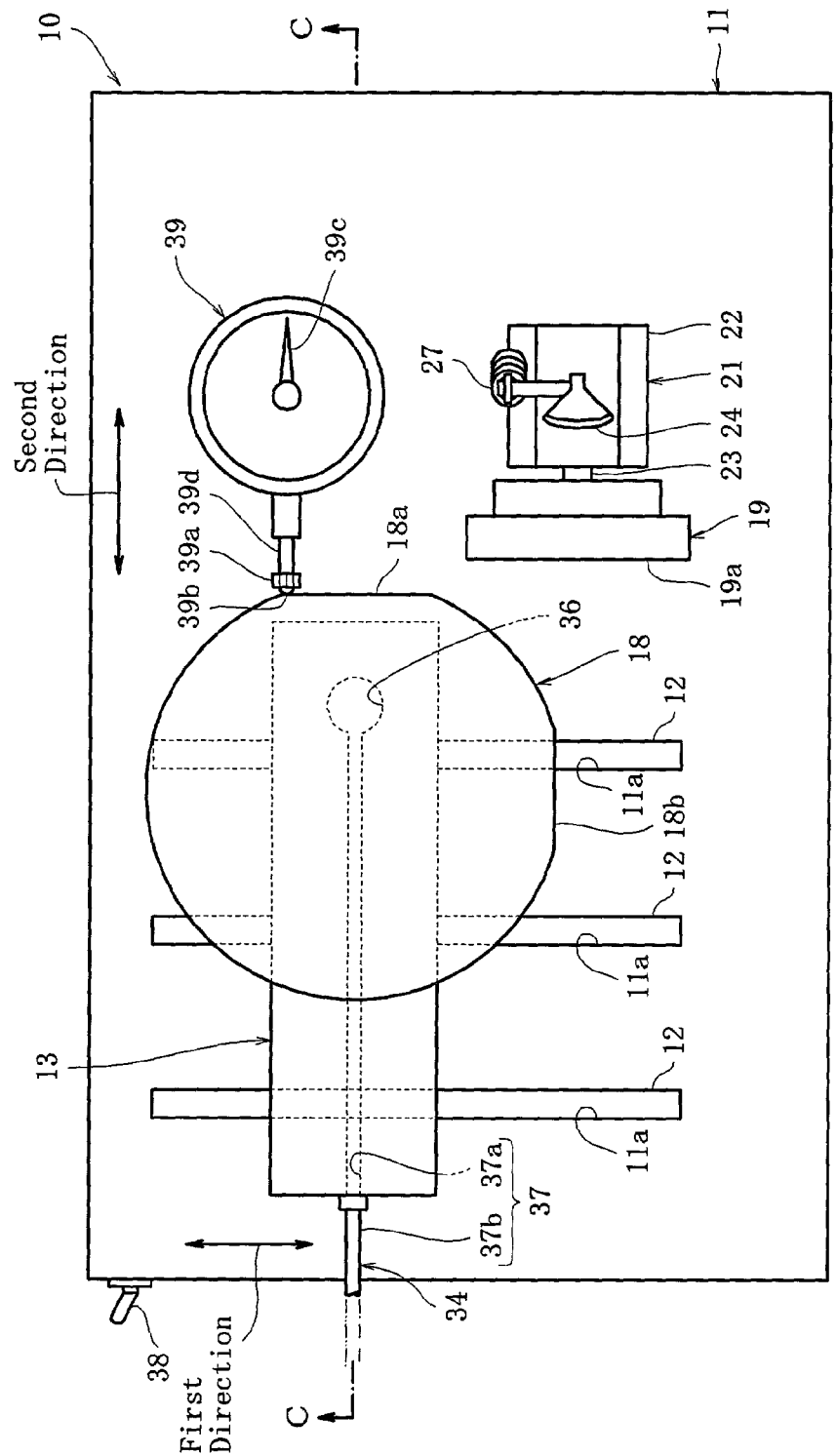
FIG. 4 is a plan view corresponding to FIG. 1, showing a state in which a platform is moved together with a wafer in the first direction to bring the Ori-Fla into measurement range of the measurement device.
Figure 6:
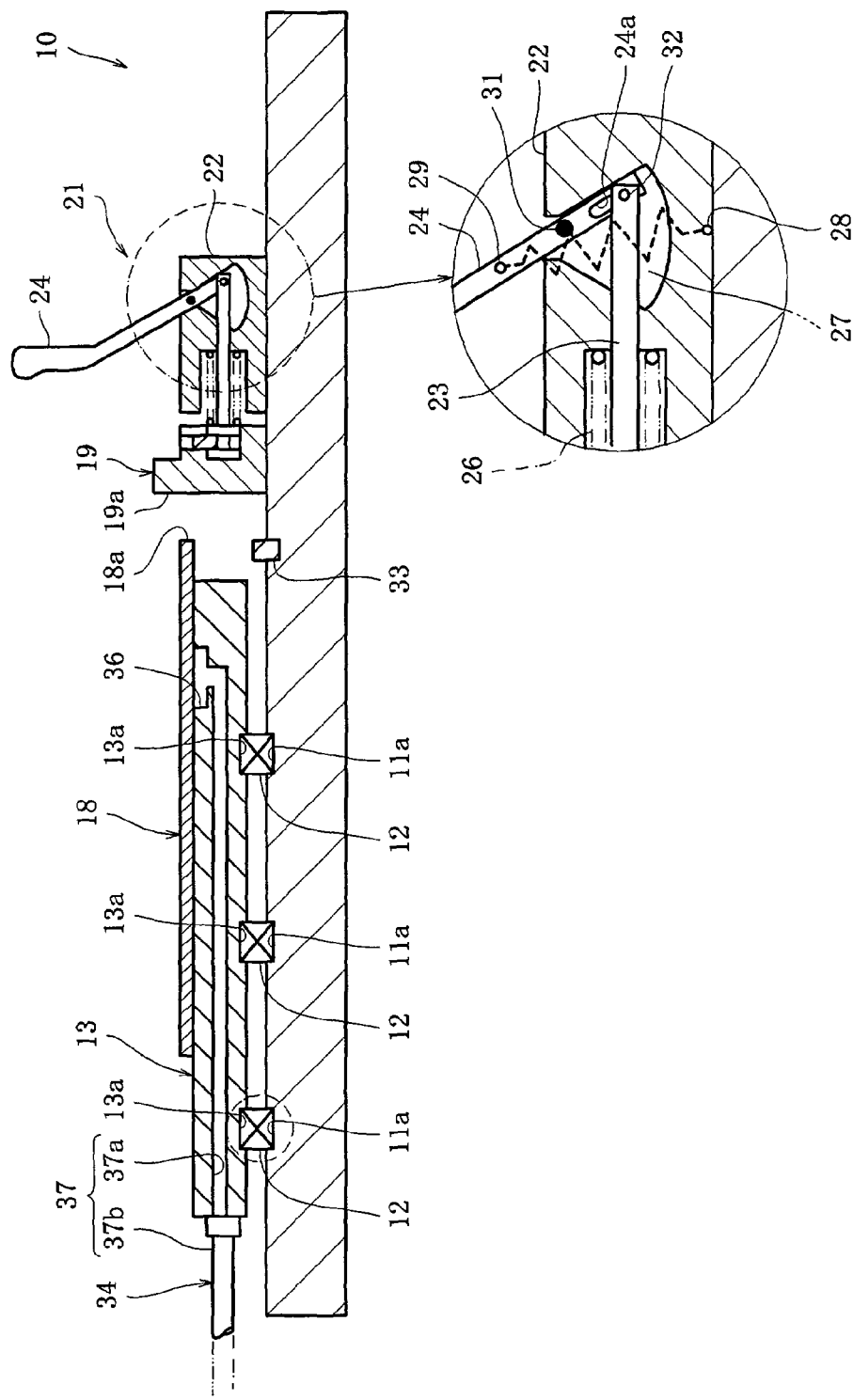
FIG. 6 is a sectional view taken along the line B-B of FIG. 3.
Figure 7:
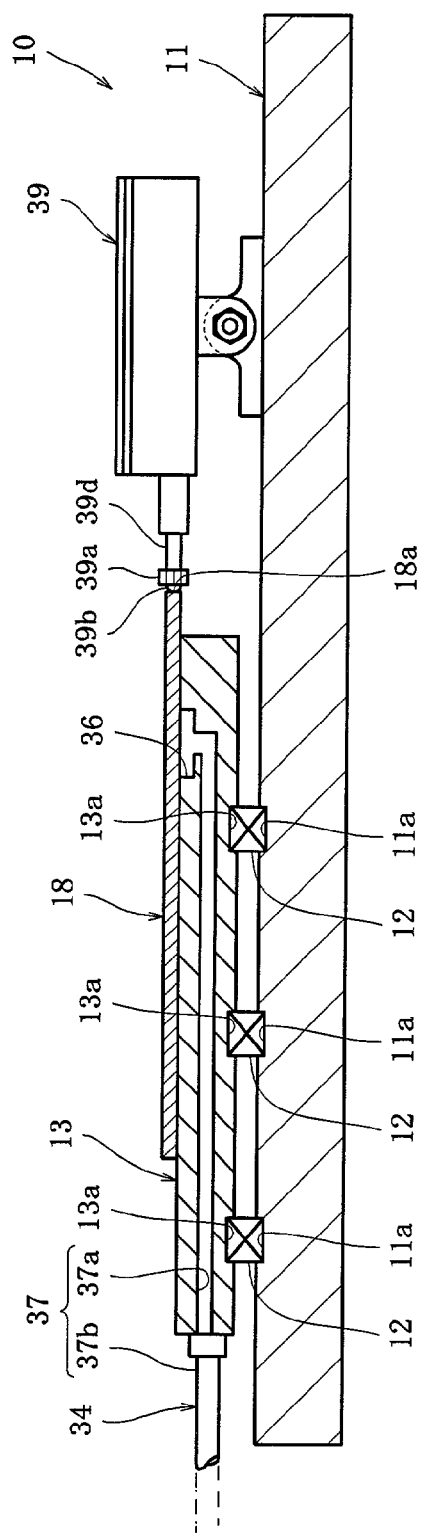
FIG. 7 is a sectional view taken along the line C-C of FIG. 4.
Figure 8:
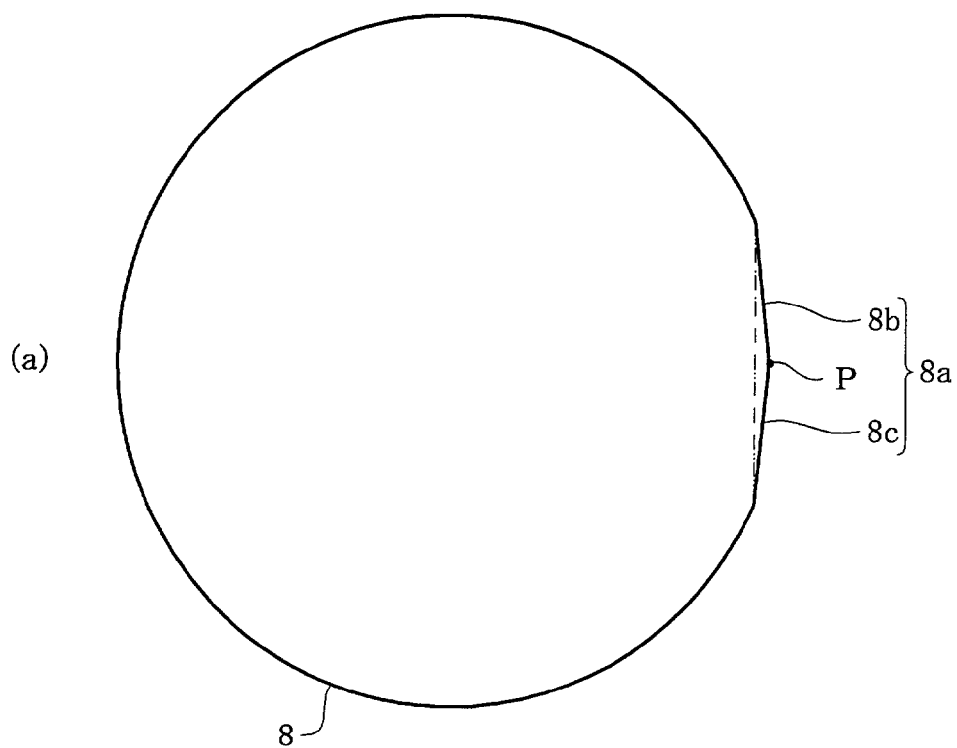
FIG. 8 is a plan view of a wafer in which the fabrication accuracy of the Ori-Fla is poor.
Figure 8:
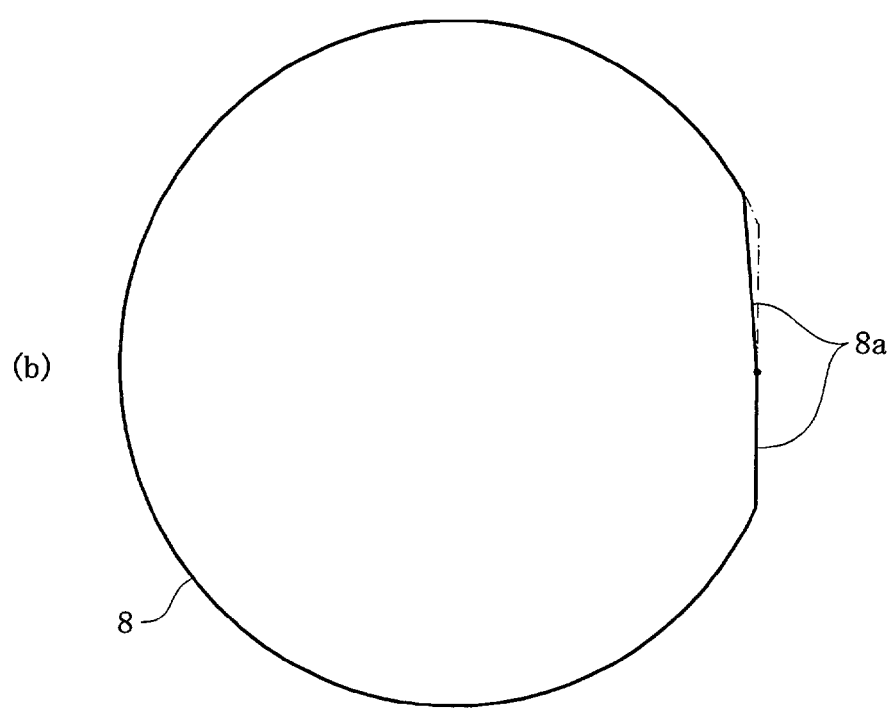

First, the selector switch 38 is turned off, and the platform 13 on which the wafer is not mounted is moved in the first direction so that the platform 13 is opposed to the block 19. Then, the operating lever 24 is operated to the first position (FIG. 5) to cause the flat face 19a of the block 19 to abut against the flat bar 33 (FIG. 1). Next, a wafer 18 is mounted on the top surface of the platform 13, and the first Ori-Fla 18a of the wafer 18 is caused to abut against the flat face 19a of the block 19 in such a manner as to be parallel with the flat face 19a (FIGS. 2 and 5). In this state, the selector switch 38 is turned on to cause the suction port 36 to communicate with the vacuum supply, by which the wafer 18 is attracted and fixed onto the platform 13. Next, the operating lever 24 is turned from the first position (FIG. 5) to the second position (FIG. 6) to move the block 19 in the second direction so as to be separated from the wafer 18 (FIGS. 3 and 6). In this state, the platform 13 on which the wafer 18 is mounted and fixed is moved in the first direction, by which the first Ori-Fla 18a is brought into measurement range with the tip end of the probe 39a of the measurement device 39 (FIGS. 4 and 7). When the platform 13 is further moved in the first direction, the steel ball 39b at the tip end of the probe 39a of the measurement device 39 rolls on the first Ori-Fla 18a, and a display 39c of the measurement device 39, for example a needle of the dial gauge deflects. The deflection of the display 39c of the measurement device 39 is read during rolling the steel ball 39b at the tip end of the probe 39a of the measurement device 39 from one end of the first Ori-Fla 18a to the other end thereof. The acceptability or non-acceptability of linearity of the first Ori-Fla 18a of the wafer 18 can be judged according to whether or not the deflection is within the maximum allowable value, for example, 25 $\mu m$. When the linearity of the first Ori-Fla 18a of another wafer 18 is measured succeedingly, the selector switch 38 is turned off, and the wafer 18 having been subjected to measurement is removed from the platform 13. Thereafter, the above-described procedure is repeated. In this manner, the linearity of the first Ori-Fla 18a of the wafer 18 can be measured accurately in a short period of time.

Although the linearity of the first Ori-Fla is measured by using the linearity measuring apparatus in the above-described embodiment, the linearity of the second Ori-Fla may also be measured by the same sequential method.

Furthermore, in the above-described embodiment, the deflection registered on the measurement device display is read visually. However, if the linearity measuring apparatus is configured so that the deflection data of the measurement device display can be outputted as an electronic signal, the Ori-Fla linearity data for each wafer can be stored by connecting the electronic signal to the input of a computer, and also the acceptability or non-acceptability of the linearity of the Ori-Fla can be analyzed/determined by means of the computer when the apparatus of the present invention is automated.

The present invention achieves the following effects: as described above, according to the present invention, the platform is moved in the first direction so as to be opposed to the block, a wafer is fixed on the platform so that the Ori-Fla abuts against the block, the block is retracted, and the platform is moved in the first direction so that the Ori-Fla is brought into measurement range with the probe of the measurement device, and the probe is lowered until contact with the Ori-Fla is made. Therefore, by reading the deflection of the display of the measurement device when the Ori-Fla is moved from one end to the other end thereof, the linearity of the Ori-Fla can be displayed quantitatively as numerical data so that the acceptability or non-acceptability of linearity of the Ori-Fla of the wafer can be determined. As a result, the linearity of the Ori-Fla of the wafer can be measured accurately in a short period of time.

Also, if the wafer fixing means has the suction port for attracting and fixing the wafer, the suction passage communicating with the suction port, and the switching valve for switching the suction port to a negative pressure or the atmospheric pressure, the wafer can be fixed on the platform by a very simple operation without damage to the wafer.

Also, if the release means for moving the block in the second direction in which the block retracts from the straight track is provided, the Ori-Fla moves in a state of being separated from the block when the platform with the wafer being mounted thereon is moved in the first direction. As a result, the wafer is not damaged.

Further, if the linearity measuring apparatus is configured so that the deflection data of the measurement device display can be outputted as an electronic signal, the Ori-Fla linearity data for each wafer can be stored by connecting the electronic signal to the input of a computer, and also the acceptability or non-acceptability of linearity of the Ori-Fla can be analyzed/determined by means of the computer when the apparatus of the present invention is automated.

What is claimed is:

1. A linearity measuring apparatus for a wafer orientation flat, comprising:
    a base in which a plurality of straight tracks are formed in a first direction;
    a platform which is configured so as to be movable in said first direction by being engaged with said plurality of straight tracks via engagement means, and is further provided with a top surface formed so as to be flat to mount a wafer having an orientation flat;
    a block which is installed on said base with a predetermined first clearance L being provided between said block and a nearest one of said plurality of straight tracks in a second direction perpendicular to said first direction, and has a flat face against which the orientation flat of said wafer mounted on said platform abuts and which is parallel with said first direction;
    wafer fixing means provided in said platform to fix said wafer in a state in which said wafer is mounted on said platform; and
    a measurement device which is installed on said base with a predetermined second clearance M being provided with said block in said first direction, and has a probe that is opposed to said plurality of straight tracks and is capable of being displaced in said second direction, wherein when a clearance between a tip end of said probe and the nearest one of said plurality of straight tracks is taken as N, the following equation (1) is satisfied:

$$0 \ \mu m < L-N \leq 100 \ \mu m.$$

2. The linearity measuring apparatus according to claim 1, wherein said wafer fixing means has a suction port formed in said platform to attract and fix said wafer, a suction passage communicating with said suction port, and a switching valve provided in said suction passage to switch said suction port to a negative pressure or atmospheric pressure.

3. The linearity measuring apparatus according to claim 1, wherein release means for moving said block in said second direction in which said block goes apart from said plurality of straight tracks is installed on said base.

4. The linearity measuring apparatus according to claim 1, wherein deflection data displayed on said measurement device can be outputted as an electronic signal.

5. The linearity measuring apparatus according to claim 1, wherein said apparatus can be applied to a wafer having a diameter in the range of 50 to 300 mm.

* * * * *